United States Patent
Brox

(10) Patent No.: US 7,049,854 B2
(45) Date of Patent: May 23, 2006

(54) SENSE AMPLIFIER HAVING LOW-VOLTAGE THRESHOLD TRANSISTORS

(75) Inventor: Martin Brox, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/745,928

(22) Filed: Dec. 23, 2003

(65) Prior Publication Data
US 2004/0178830 A1    Sep. 16, 2004

(30) Foreign Application Priority Data
Dec. 23, 2002   (DE) ................ 102 60 602

(51) Int. Cl.
*G01R 19/00* (2006.01)
(52) U.S. Cl. ........................................... 327/51
(58) Field of Classification Search ............ 327/51–52, 327/55, 57, 215, 219; 365/203–208
See application file for complete search history.

(56) References Cited

U.S. PATENT DOCUMENTS

| | | | | |
|---|---|---|---|---|
| 5,623,446 A * | 4/1997 | Hisada et al. | .......... | 365/189.11 |
| 5,862,089 A * | 1/1999 | Raad et al. | .......... | 365/203 |
| 5,966,319 A * | 10/1999 | Sato | .......... | 365/154 |
| 6,222,394 B1 * | 4/2001 | Allen et al. | .......... | 327/52 |
| 6,597,612 B1 * | 7/2003 | Yamauchi | .......... | 365/205 |
| 6,806,737 B1 * | 10/2004 | Sung et al. | .......... | 326/98 |

FOREIGN PATENT DOCUMENTS

DE          195 36 486 C2    8/2003

* cited by examiner

*Primary Examiner*—My-Trang Nu Ton
(74) *Attorney, Agent, or Firm*—Maginot, Moore & Beck

(57) ABSTRACT

The invention provides a sense amplifier apparatus (100) for bit line signals (103, 104) having a bit line pair which comprises two bit lines (107, 108) to which complementary bit line signals (103, 104) are applied, and a switching device (101) which is connected cross-coupled between the bit line, with a first transistor pair (201, 202) and a second transistor pair (105, 106), with the switching device having a switching transistor pair which comprises two transistors (205; 206) connected in series with the first transistors (201; 202), in which a switching signal (207) can be applied to the gates of the switching transistors (205; 206) and, furthermore, a holding device (102) being connected between the bit lines (107, 108) and maintaining the levels, which are switched by the switching device (101), on the bit line signals (103, 104) which are applied to the bit lines (107, 108).

15 Claims, 6 Drawing Sheets

Time (s)

ical voltage level for a time which can likewise be predetermined.

SENSE AMPLIFIER HAVING LOW-VOLTAGE THRESHOLD TRANSISTORS

FIELD OF THE INVENTION

The present invention relates to a sense amplifier (S/A) for sensing and amplification of bit line signals, and relates in particular to a sense amplifier which can be operated with a low array voltage.

BACKGROUND

A sense amplifier which is arranged in a DRAM environment (DRAM=Dynamic Random Access Memory) is illustrated within the area of the dashed line A in FIG. 1. Bit line signals IBLT and IBLC are supplied via bit lines in the sense amplifier.

The conventional cross-coupled sense amplifier illustrated in FIG. 1 is shown in more detail in the split—sense amplifier—arrangement in FIG. 2.

FIG. 3 shows the associated timing diagrams, with FIG. 3(a) showing the bit line signals IBLC (dashed line) and IBLT (dashed-dotted line) for sensing with precharging, as a function of time. The time axis is, by way of example, subdivided into a time period from 0 to 80 ns (nanoseconds).

FIG. 3(b) shows the word line signal WL (dashed line) as well as two signals which are input (EQLR) to a downstream amplifier group, as well as a signal EQLL which is supplied to an upstream amplifier group. At the start of the measuring cycle, the signals EQLR and MUX1 (see FIG. 1) are not passed on.

In addition, the signal MUXr which is supplied to a transistor pair downstream from the sense amplifier in FIG. 1, is driven from an intermediate level VINP to a raised level VPP. In parallel with this, the level on the word line WL is raised such that the cell capacitor of a memory cell array (DRAM) can be read.

When a "0" is sensed, as is described here, the voltage level on the bit line IBLT is reduced after a charge transfer. Sensing by the sensor amplifier is then started by setting a signal SAN which is arranged at the junction point between the transistors N1 and N2, to a low level and a signal SAP, which is arranged at the junction point between the transistors P1 and P2 to a high level.

In this way, the transistors N1, N2 and P1, P2 start to act as a cross-coupled inverter or as a switching device, as a result of which the voltage IBLT is amplified to zero, and the voltage IBLC is amplified to VBLH.

At the end of the cycle, as is illustrated in the timing diagram in FIG. 3(b), the word line level WL is reduced (in this example at about 52 ns). All the other voltages are then returned to the initial level, which leads to automatic precharging to the initial level VBLH/2.

The advantages of this conventional method are that all that is required for sensing and amplification in the sense amplifier that is annotated A in FIG. 1 is to provide a charge equivalent to the capacitance of the bit line, multiplied by VBLH/2.

One major disadvantage of this conventional method is that the voltage VBLH cannot be reduced sufficiently, as is required for future generations of DRAM sense amplifiers. When a "0" is sensed, the transistor N1 has to discharge the line IBLT. In contrast, the gate/source voltage of the transistor N1 is often even less than the voltage level VBLH/2.

The source level of the transistor N1, that is to say the level SAN, is thus drawn to "0", and the IBLC level is reduced slightly from the precharging level VBLH/2 as a result of the line coupling capacitance between IBLT and IBLC. In consequence, the lower the setting of the level VBLH, the more slowly the sensing and amplification are carried out in the sense amplifier. This cannot be tolerated in circuit arrangements, since the sense speed determines the minimum time between activation of a row and the capability to read from this row for the first time. This time is specified as tRCD in the data sheet.

Conventional solutions to this problem comprise reduction of the threshold voltages for the relevant devices. However, the level to which a threshold voltage can be reduced is restricted by the parallel current through the devices when signals on the bit lines are amplified.

In this situation, the entire level VBLH is applied between the source SAN and drain (for example IBLC in FIG. 2). Since, however, thousands of bit lines have to be set or reset in parallel in conventional memory apparatuses (DRAMs), only an extremely small parallel current or leakage current can be allowed.

Any reduction in VBLH by reducing the threshold voltage (Vth) is thus subject to tight limits, so that VBLH cannot be reduced effectively.

A further proposal that has been made is to operate SAN negatively. This is subject to the disadvantage that the SAN driver is highly complicated, that is to say it has to provide three voltage levels, that is to say VBLH/2, ground and a negative value.

Furthermore, the FET junction of the transistors are biased in a forward direction when SAN is driven negatively.

A further proposal to solve the above problem comprises the provision of ground-level precharging rather than carrying out VBLH/2 precharging. This results in the disadvantage of an increased power consumption, since sensing and amplification now require a charge which is governed by the capacitance of the bit line multiplied by VBLH (previously: multiplied by VBLH/2).

A further substantial disadvantage of conventional array architectures is that ground-level precharging is no longer possible because an adequate current must be ensured when the array transistor is in the off state, with WO being biased negatively with respect to the bit line when it is not selected. Ground-level precharging requires, however, that the precharging level should not be supplied via ground. A high leakage current or a high parallel current thus disadvantageously results in the case of a negatively biased bit line WL with a grounded bit line.

One object of the present invention is thus to provide a sense amplifier apparatus and a method for sensing and amplification of bit line signals, in which an operating voltage can be reduced, while overcoming the disadvantageous effects of sense amplifier apparatuses according to the prior art.

SUMMARY

One major idea of the invention is to add a conventional sense amplifier, which is in the form of a switching device, to an additional holding device, which is once again in the form of a transistor pair.

This allows switching transistors to be added to the transistor pair in the switching device, that is to say to be connected in series with the first transistor, in order to ensure that they are switched on reliably at low operating voltages for a time which can be predetermined, with a holding function then being ensured, that is to say maintenance of a voltage level which can be predetermined on the bit lines, by means of a further transistor pair which is cross-coupled in the holding device.

This advantageously results in the capability to reduce a threshold voltage of the transistors in the switching device, thus allowing a low operating voltage to be achieved.

The sense amplifier apparatus according to the invention for bit line signals essentially has:
a) a bit line pair which comprises bit lines to which two complementary bit line signals are applied; and
b) a switching device which is connected cross-coupled between the bit lines and has:
b1) a first transistor pair which comprises two first transistors connected in series between the bit lines, with the gates of the first transistor pair being cross-coupled to the bit lines, and the two first transistors being connected by means of a first connection; and
b2) a second transistor pair, which comprises two second transistors connected in series between the bit lines with the gates of the second transistors being cross-coupled to the bit lines, and the two second transistors being connected by means of a second connection; in which the switching device also has a switching transistor pair, which comprises two switching transistors connected in series with the first transistors with a series circuit respectively comprising a first transistor and a switching transistor being connected between a respective bit line and the first connection, and in which case a switching signal can be applied to the gates of the switching transistors, and a holding device being connected between the bit lines and maintaining the levels, which are switched by the switching device, of the bit line signals which are applied to the bit lines.

Advantageous developments and improvements of the respective subject matter of the invention can be found in the dependent claims.

According to one preferred development of the present invention, the holding device has a third transistor pair, which comprises two third transistors connected in series between the bit lines, with the gates of the third transistors being cross-coupled to the bit lines, and the two third transistors being connected by means of a third connection.

According to a further preferred development of the present invention, the switching transistors as well as the first transistors, the second transistors and the third transistors are in the form of field-effect transistors.

According to yet another preferred development, the switching transistors as well as the first transistors, the second transistors and the third transistors are in the form of bipolar transistors.

According to yet another preferred development of the present invention, the switching transistors have a low threshold voltage.

According to yet another preferred development of the present invention, the series circuit comprising the respective first transistors and the switching transistors is in the form of a structure similar to an NAND.

Furthermore, the method according to the invention for sensing and amplification of bit line signals essentially has the following steps:
a) supply of two bit line signals by means of a bit line pair which comprises two bit lines;
b) switching on a switching device which is connected cross-coupled between the bit lines and has:
b1) a first transistor pair which comprises two first transistors connected in series between the bit lines, with the gates of the first transistor being cross-coupled to the bit lines, and the two first transistors being connected by means of a first connection; and
b2) a second transistor pair, which comprises two second transistors connected in series between the bit lines with the gates of the second transistors being cross-coupled to the bit lines, and the two second transistors being connected by means of a second connection, in which two switching transistors, which are provided in series with the first transistors in the switching device, are switched on, with a series circuit respectively comprising a first transistor and a switching transistor being formed between a respective bit line and the connection, with a switching signal which is applied to the gates of the switching transistors being used for switching on, and the level, which is switched by the switching device, of the bit line signals which are applied to the bit lines being maintained by means of a holding device which is connected between the bit lines.

According to yet another preferred development of the present invention, the bit line signals on the bit line pair are complementary to one another.

According to yet another preferred development of the present invention, a third connection between a third transistor pair in the holding device and the second connection of the switching device have the same signal level applied to them.

BRIEF DESCRIPTION OF THE DRAWINGS

Exemplary embodiments of the invention will be explained in more detail in the following description and are illustrated in the drawings, in which:

FIG. 3($b$) shows word line signals and further signals in the conventional arrangement;

DETAILED DESCRIPTION

Identical reference symbols denote identical or functionally identical components or steps in the Figures.

Figure 4:
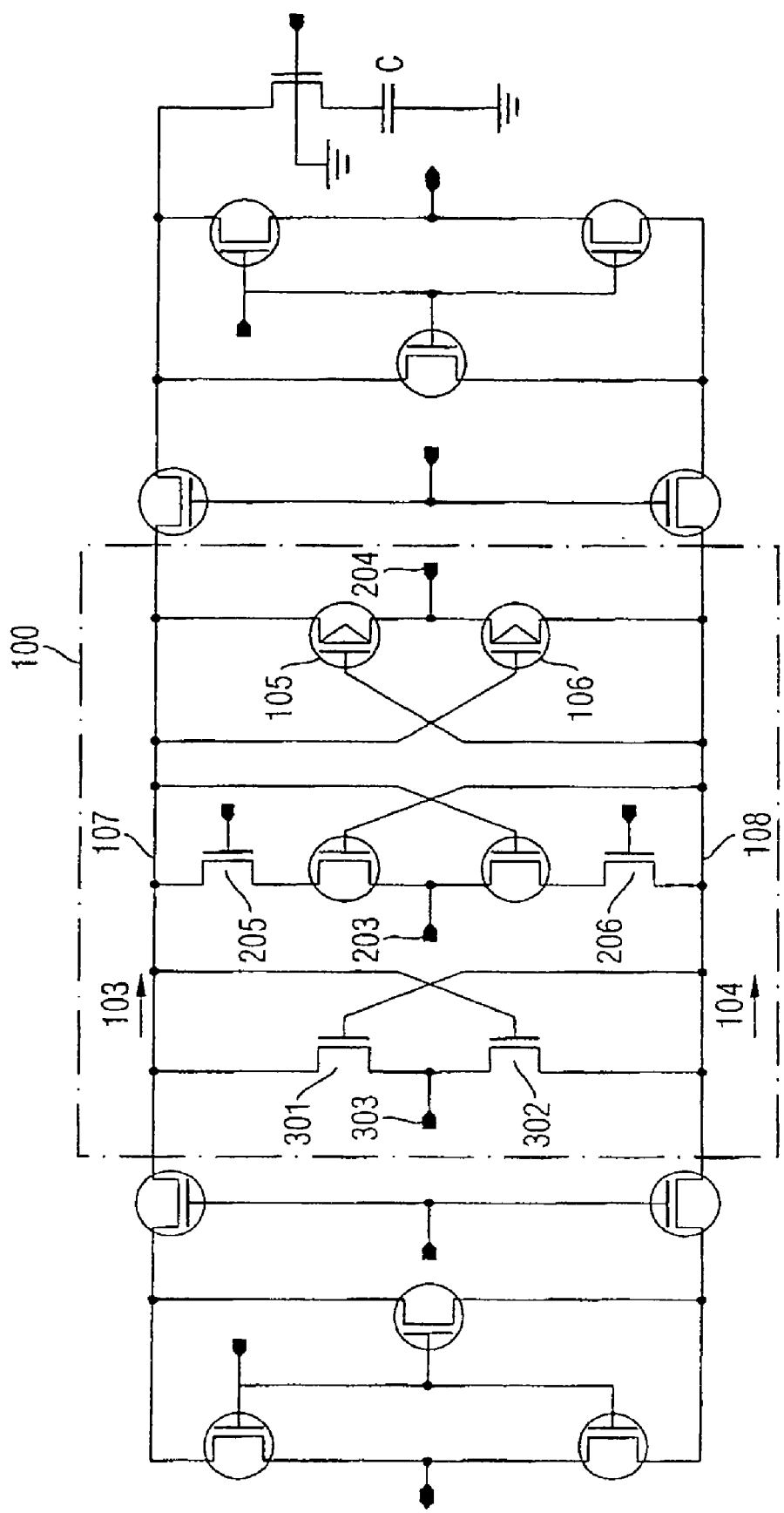
FIG. 4 shows a sense amplifier apparatus, which is fitted into a bit line/word line structure, according to one preferred exemplary embodiment of the present invention.

FIG. 4 shows an overview circuit diagram of the sense amplifier apparatus 100 according to the invention, as is embedded in a bit line/word line environment for example for a DRAM (DRAM=Dynamic Random Access Memory). Bit line signals 103 and 104, which are preferably complementary, are supplied from this environment to the sense amplifier apparatus 100.

Figure 5:
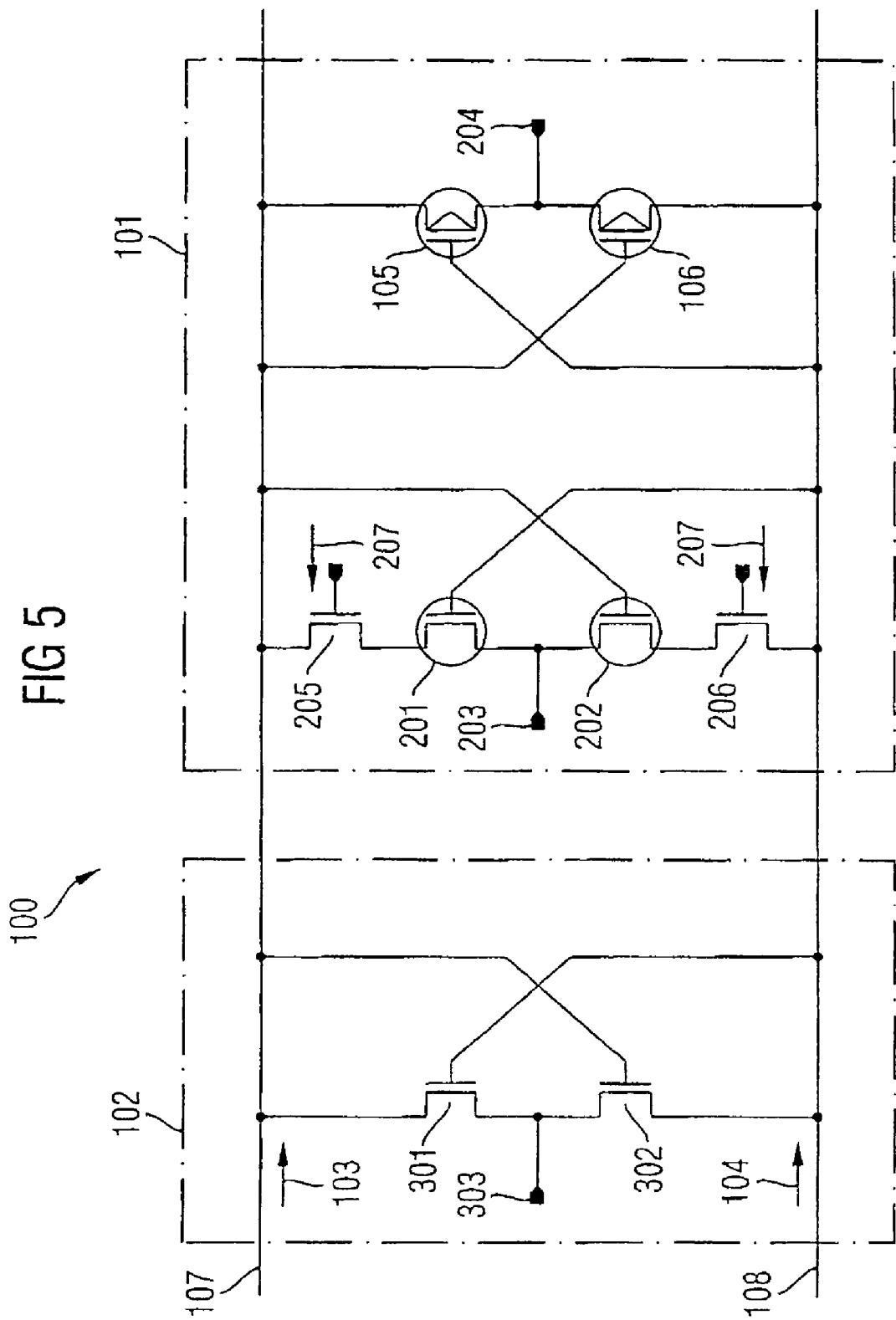
FIG. 5 shows the sense amplifier apparatus from FIG. 4, illustrated in more detail.

The area 100 which is surrounded by dashed lines in FIG. 4 is illustrated in more detail in FIG. 5.

FIG. 5 shows two bit lines 107 and 108, which are referred to as a bit line pair. The bit line signals 103 and 104 are applied to these bit lines, and must on the one hand be sensed and on the other hand be amplified and/or maintained in the sense amplifier apparatus.

The sense amplifier apparatus 100 according to the invention is subdivided into two devices, that is to say a switching device 101 and a holding device 102. In contrast to the sense amplifier apparatuses according to the prior art, this results in the switching of the bit lines being expediently separated by circuitry from maintenance of the signal levels on the bit lines.

As in the case of a conventional sense amplifier, a first transistor pair 201, 202 and a second transistor pair 105, 106 are provided in the switching device 101, and are cross-coupled to form an inverter. The source/drain junction of each of the transistor pairs, which are connected in series, in each case forms a first connection 203 for the first transistor pair 201, 202 and a second connection 204 for the second transistor pair 105, 106.

According to the invention, the transistors in the first transistor pair 201, 202 are no longer directly connected to the bit lines 107 and 108, respectively. Switching transistors 205 and 206, respectively, are connected between the bit lines and the respective first transistors, and a switching signal 207 can be applied to their gates.

This results in a series circuit comprising the first switching transistor 205, the first transistor 201 of the first transistor pair, the second transistor 202 of the first transistor pair and the second switching transistor 206, in this sequence, between the bit line 107 and the bit line 108. The additional switching transistors 205 and 206 ensure that the sense amplifier is reliably switched on, and thus that the associated levels are reliably applied to the bit lines, even when the operating voltages are low.

Figure 6:
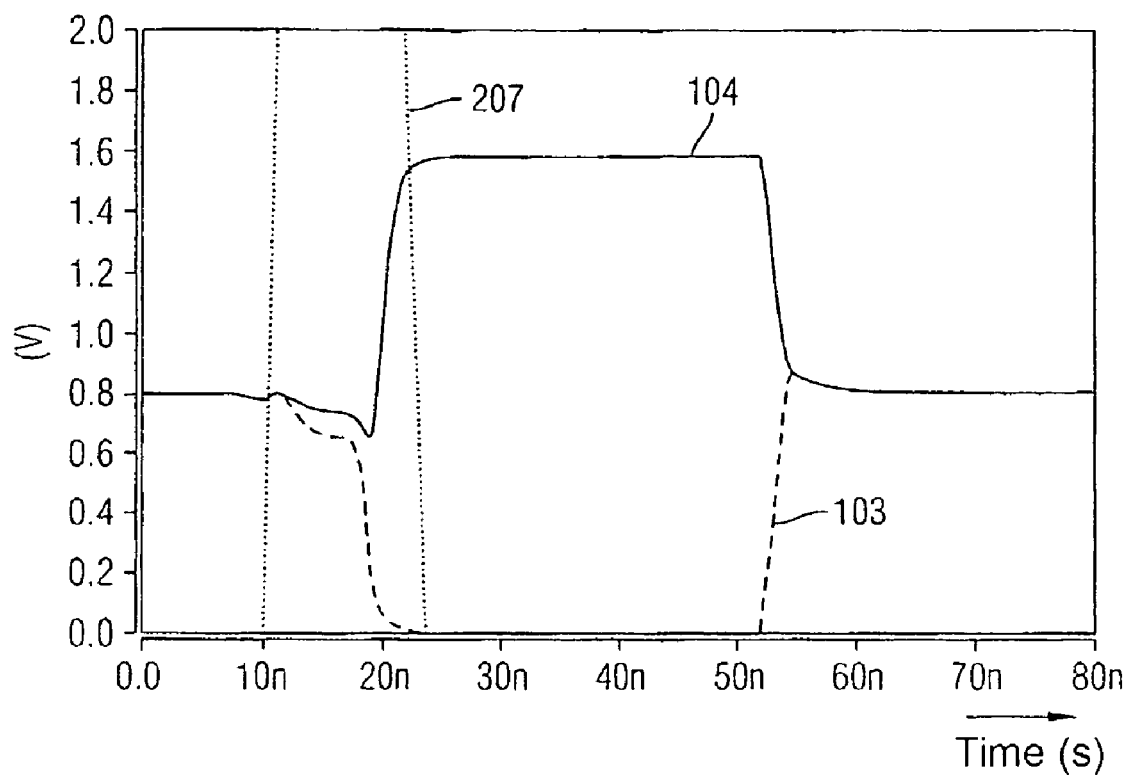
FIG. 6 shows a timing diagram of the bit line signals and of the switching signal, as occur with the method according to the invention.

FIG. 6 shows a timing diagram of the major signal waveforms for the sense amplifier apparatus according to the invention. In FIG. 6, the signal waveforms are shown as voltages (0.0 to 2.0 V) as a function of time (0.0 ns to 80 ns).

The dotted line shows the switching signal 207. In the exemplary embodiment according to the invention, this switching signal is limited to a time period in the range of 10 ns to about 25 ns. This means that the switching signal is pulsed or "gated" before sense amplifier apparatus start to sense the bit line signals. The high level of the switching signal 207 is maintained for a time period which is sufficient to end the sensing of the signal levels. This time period is about 15 ns in FIG. 6. Since the switching signal 207 is reduced to a low level (in this example 0V) after this time period, the threshold voltages of the two transistors in the first transistor pair, that is to say the transistors 201 and 202, may be very low, since there is no restriction with respect to a parallel current or a leakage current as in the prior art.

The maintenance of the switched state or the maintenance of the signal levels which are applied to the bit lines 107 and 108 is, according to the invention, ensured by means of the holding device 102. The holding device 102 has a third transistor pair, comprising the transistors 301 and 302, which are connected in series between the bit lines 107 and 108 and are connected via a third connection 303.

The gates of the third transistors 301 and 302 are cross-coupled in the conventional manner, that is to say the gate of the transistor 301 whose drain is connected to the bit line 107 is connected to the other bit line 108, while the gate of the transistor whose source is connected to the bit line 108 is connected to the bit line 107.

The fast switching device 101 advantageously means that devices which have a very low threshold voltage and can nevertheless carry out fast switching processes may be used for the transistors 201, 202 which form the first transistor pair.

This is particularly important when the supply voltage or operating voltage for the entire sense amplifier apparatus is intended to be reduced. This third transistor pair 301, 302 which is provided in the holding device 102 may, in contrast, have normal threshold voltages since the switching transistors 205 and 206 for the switching device 101 are driven by the full internal chip voltage (operating voltage).

The transistors 301 and 302 which are provided in the holding device ensure only that the levels (which are present on the bit lines 107 and 108) of the bit line signals 103 and 104, respectively, are maintained after sensing and during a write access to the bit line pair in the cross-coupled state. There is no longer any need to provide a time-critical switching function with regard to the bit line signals being passed on by the transistors 301 and 302 in the holding device 102.

Although the apparatus according to the invention requires four more additional transistors than the conventional sense amplifier arrangement, these may nevertheless be relatively small.

The switching transistors 205 and 206 are driven by the full internal voltage, and are connected in series with the respective transistors 201 and 202 in the first transistor pair. The transistors 201, 202, 205 and 206 may therefore have a configuration similar to an NAND, which is advantageous for space-saving reasons.

Future technologies will use chip voltages VBLH in the order of magnitude of 1.3 V, compared with 1.5 V for VINT. With a difference in a threshold voltage between a first transistor pair 201, 202 with a low threshold voltage and a switching transistor pair 205, 206 with a normal threshold voltage, the current driver capability of the switching transistors 205, 206 is typically twice to four times the current driver capability of the transistors in the first transistor pair 201, 202 for the same (gate) width.

If necessary, the current driver capability can be increased further by operating the switching transistors 205 and 206 in the switching transistor pair by means of an increased driver voltage, which is available on the chip. The third transistors 301, 302 in the third transistor pair, which is arranged in the holding device 102, are advantageously not in the critical path.

Figure 1:
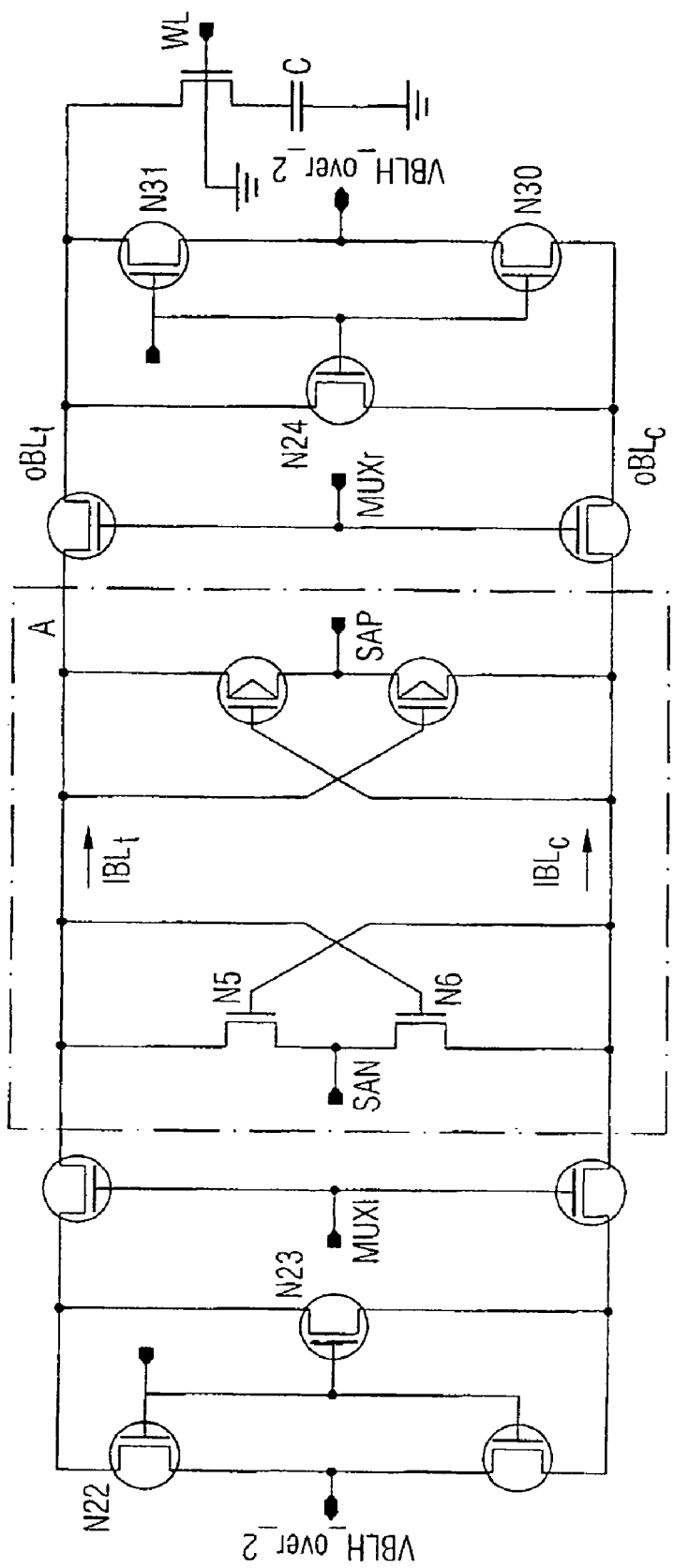
FIG. 1 shows a bit line/word line arrangement with a central sense amplifier according to the prior art.
Figure 2:
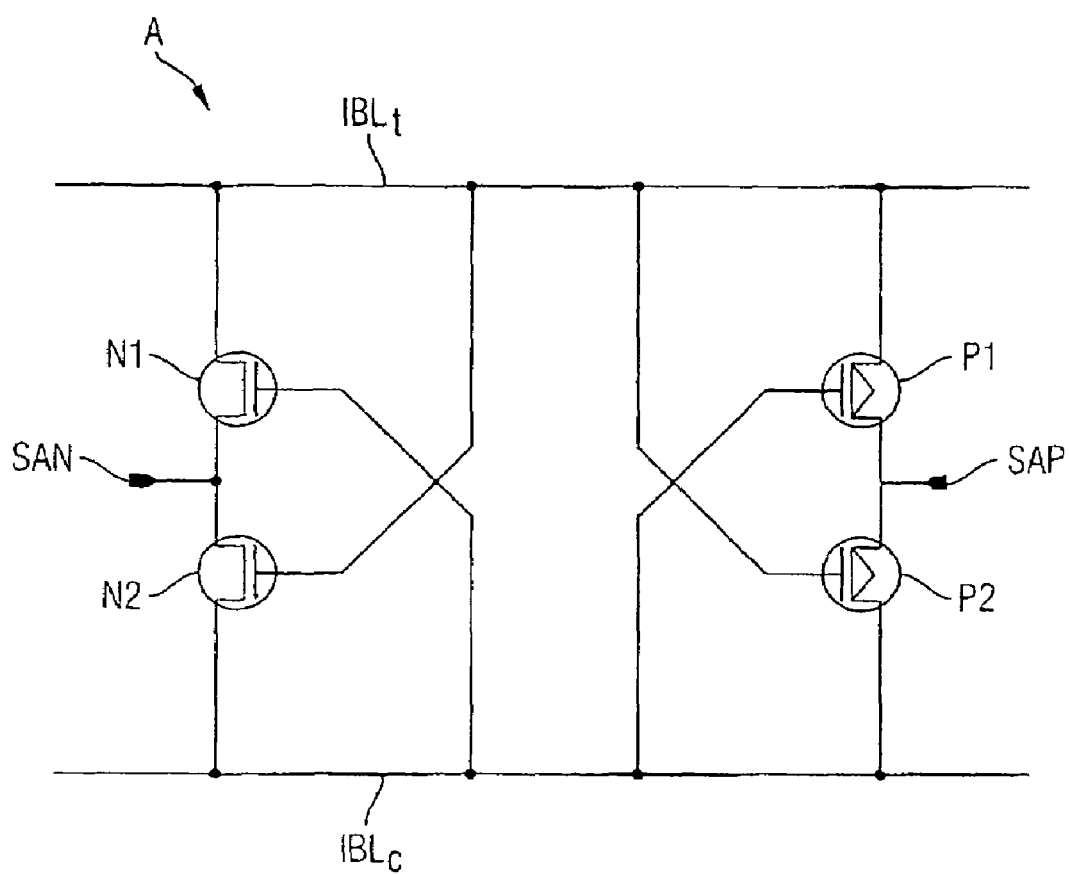
FIG. 2 shows the circuit area surrounding the dashed line A in FIG. 1.
Figure 3A:
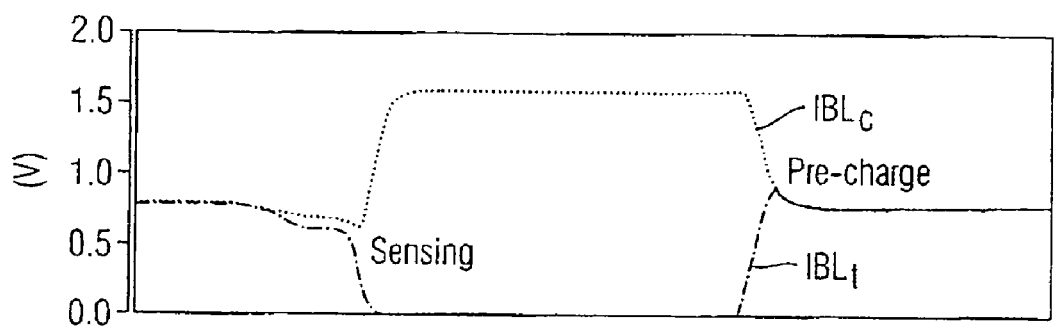
FIG. 3($a$) shows a circuit diagram of the bit line signals, as occur in the conventional sense amplifier arrangement.
Figure 3B:
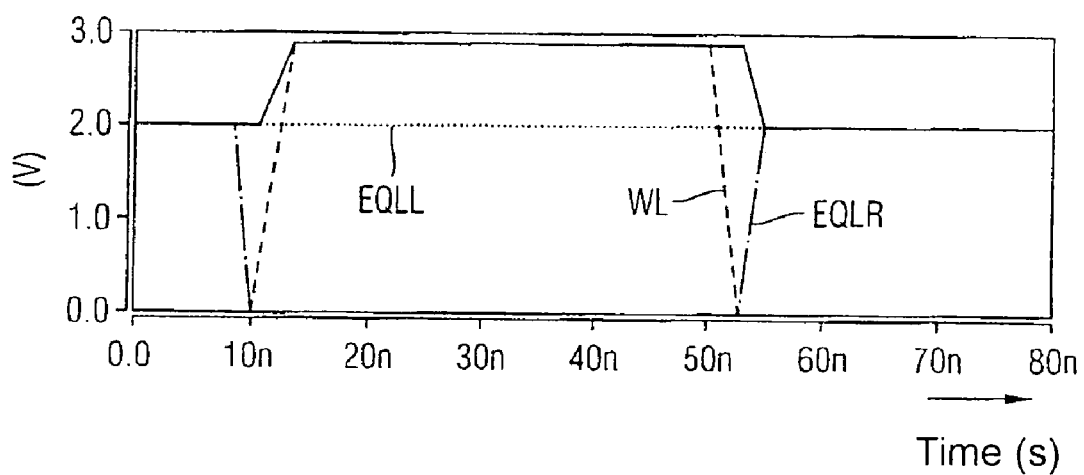

With regard to the conventional sense amplifier apparatus and timing diagrams for conventional methods as illustrated in FIGS. 1 to 3, reference is made to the introduction to the description.

Although the present invention has been described above with reference to preferred exemplary embodiments, it is not restricted to them but can be modified in many ways.

The invention is also not restricted to the cited application options.

The invention claimed is:

1. A sense amplifier for low voltage sensing that includes a switching circuit, the switching circuit comprising:
   a pair of low voltage threshold transistors being cross-coupled to a pair of complementary sensing lines so that each transistor of the pair is driven by one of the complementary sensing lines; and
   a pair of switching transistors, one of the switching transistors being coupled between one of the complementary sensing lines and one of the low voltage threshold transistors and the other of the switching transistors being coupled between the other one of the complementary sensing lines and the other one of the low voltage threshold transistors, the switching transistors being driven by a full internal voltage of a sense amplifier, the switching transistors having gates operably coupled to receiving a switching signal, the switching signal having a time period of approximately between ten and twenty-five nanoseconds, such that the switching signal is pulsed before the sense amplifier starts the low voltage sensing.

2. The sense amplifier of claim 1 further comprising:
a holding circuit coupled to the complementary sensing lines, the holding circuit for maintaining the voltage levels on the complementary sensing lines after signal sensing and during a write access of the complementary sensing lines.

3. The sense amplifier of claim 2, the holding circuit further comprising:
a pair of transistors being cross-coupled to the complementary sensing lines and the complementary sensing lines coupling the holding circuit to the switching circuit.

4. The sense amplifier of claim 3 wherein the transistors of the transistor pair forming the holding circuit have threshold voltages greater than the low voltage threshold transistors of the switching circuit.

5. The sense amplifier of claim 3 wherein the switching transistors and the low voltage threshold transistors of the switching circuit and the transistor pair of the holding circuit are field effect transistors.

6. The sense amplifier of claim 3 wherein the switching transistors and the low voltage threshold transistors of the switching circuit and the transistor pair of the holding circuit are bipolar transistors.

7. The sense amplifier of claim 1 wherein the switching transistors and the low voltage threshold transistors are field effect transistors.

8. The sense amplifier of claim 1 wherein the switching transistors and the low voltage threshold transistors are bipolar transistors.

9. A method for sensing and amplifying bit line signals comprising:
coupling a pair of complementary sensing lines to a pair of low voltage threshold transistors so that each transistor of the transistor pair is driven by one of the complementary sensing lines; and
driving a pair of switching transistors coupled between the complementary sensing lines and the low voltage threshold transistors so that a sense amplifier comprised of the transistor pair and the pair of switching transistors is reliably switched on,
wherein a switching signal is applied to gates of the switching transistors, the switching signal having a time period of approximately between ten and twenty-five nanoseconds, such that the switching signal is pulsed before the sense amplifier starts the low voltage sensing.

10. The method of claim 9 further comprising:
maintaining the voltage levels on the complementary sensing lines after signal sensing and during a write access of the complementary sensing lines.

11. The method of claim 10, the maintenance of the voltage levels on the complementary sensing lines further comprise:
coupling the switching transistors to a pair of transistors that are cross-coupled to the complementary sensing lines.

12. The method of claim 9 further comprising:
driving the switching transistors with the operating voltage of the sense amplifier.

13. The method of claim 9 further comprising:
driving the switching transistors before the sense amplifier begins to sense the a signal on the complementary sensing lines.

14. A sense amplifier comprising:
a) a switching circuit coupled between a pair of complementary sensing lines, wherein the switching circuit includes:
a1) a pair of low-voltage threshold transistors cross-coupled to the complementary sensing lines; and
a2) a pair of switching transistors, one of the switching transistors being coupled between one of the complementary sensing lines and one of the low-voltage threshold transistors and the other one of the switching transistors being coupled between the other one of the complementary sensing lines and the other one of the low-voltage threshold transistors, the switching transistors having gates operably coupled to receiving a switching signal, the switching signal having a time period of approximately between ten and twenty-five nanoseconds, such that the switching signal is pulsed before the sense amplifier starts the low voltage sensing;
and
b) a holding circuit coupled between the pair of complementary sensing lines and coupled to the switching circuit so that the voltage levels on the complementary sensing lines are maintained after signal sensing and during a write access of the complementary sensing lines.

15. The sense amplifier of claim 14 wherein the holding circuit comprises:
a pair of transistors being cross-coupled to the complementary sensing lines and the complementary sensing lines coupling the holding circuit to the switching circuit.

* * * * *